United States Patent
Garcia-Gabin et al.

(10) Patent No.: US 11,785,749 B2
(45) Date of Patent: Oct. 10, 2023

(54) METHOD OF CONTROLLING COOLING IN A DATA CENTRE

(71) Applicant: ABB Schweiz AG, Baden (CH)

(72) Inventors: Winston Garcia-Gabin, Solna (SE); Kateryna Mishchenko, Västerås (SE)

(73) Assignee: ABB Schweiz AG, Baden (CH)

( * ) Notice: Subject to any disclaimer, the term of this patent is extended or adjusted under 35 U.S.C. 154(b) by 171 days.

(21) Appl. No.: 17/266,830

(22) PCT Filed: Aug. 13, 2019

(86) PCT No.: PCT/EP2019/071648
§ 371 (c)(1),
(2) Date: Feb. 8, 2021

(87) PCT Pub. No.: WO2020/035471
PCT Pub. Date: Feb. 20, 2020

(65) Prior Publication Data
US 2021/0352831 A1 Nov. 11, 2021

(30) Foreign Application Priority Data
Aug. 14, 2018 (EP) ..................................... 18188846

(51) Int. Cl.
*H05K 7/20* (2006.01)
*G06F 1/20* (2006.01)

(52) U.S. Cl.
CPC ......... *H05K 7/20836* (2013.01); *G06F 1/206* (2013.01); *H05K 7/20172* (2013.01); *H05K 7/20209* (2013.01); *H05K 7/20745* (2013.01)

(58) Field of Classification Search
CPC ........... H05K 7/20836; H05K 7/20172; H05K 7/20209; H05K 7/20745; G06F 1/206
See application file for complete search history.

(56) References Cited

U.S. PATENT DOCUMENTS

| | | | | |
|---|---|---|---|---|
| 7,472,558 | B1* | 1/2009 | Narita | H05K 7/20836 700/278 |
| 9,003,003 | B1* | 4/2015 | Hyser | H04L 9/40 700/35 |

(Continued)

FOREIGN PATENT DOCUMENTS

| | | |
|---|---|---|
| AT | 510328 A2 | 3/2012 |
| CN | 103765113 A | 4/2014 |

(Continued)

OTHER PUBLICATIONS

Yao, L.; Huang, J.-H. Multi-Objective Optimization of Energy Saving Control for Air Conditioning System in Data Center. Energies 2019, 12, 1474. https://doi.org/10.3390/en12081474 (Year: 2019).*

(Continued)

*Primary Examiner* — Thomas C Lee
*Assistant Examiner* — Tyler Dean Hedrick
(74) *Attorney, Agent, or Firm* — WHITMYER IP GROUP LLC

(57) ABSTRACT

A method of controlling the cooling of servers in a data center including a plurality of server racks each including a plurality of servers, the cooling being provided by aisle cooling units via a cold isle and by server fans, wherein the method includes: obtaining temperature measurements from temperature sensors in the data center, performing an optimization of the total power consumption of the aisle cooling units and of the servers based on the temperature measurements, with constraints on a cold aisle temperature and on an air flow level of the aisle cooling units, and controlling the aisle cooling units based on the optimization.

16 Claims, 1 Drawing Sheet

(56) References Cited

U.S. PATENT DOCUMENTS

| | | | |
|---|---|---|---|
| 2013/0042639 A1 | 2/2013 | Kobayashi et al. | |
| 2014/0344320 A1* | 11/2014 | Wallner | G06T 11/206 |
| | | | 708/207 |
| 2015/0180719 A1* | 6/2015 | Wu | H04L 41/0896 |
| | | | 709/224 |
| 2016/0234972 A1* | 8/2016 | Billet | H05K 7/20836 |
| 2017/0187592 A1 | 6/2017 | Ghosh et al. | |
| 2017/0261949 A1* | 9/2017 | Hoffmann | G05B 13/0265 |
| 2018/0026906 A1* | 1/2018 | Balle | G06F 3/064 |
| | | | 709/226 |
| 2018/0059745 A1* | 3/2018 | Gross | H05K 7/20836 |

FOREIGN PATENT DOCUMENTS

| | | |
|---|---|---|
| WO | 2013039645 A2 | 3/2013 |
| WO | 2015134655 A2 | 9/2015 |

OTHER PUBLICATIONS

Deb, Kalyan. (2001). Multi-objective Optimization Using Evolutionary Algorithms. Wiley, New York. (Year: 2001).*

Indian Office Action with Translation; Application No. 202147004047; dated Mar. 26, 2021; 5 Pages.

Emad Samadiani; "Energy Efficient Thermal Management of Data Centers Via Open Multi-Scale Design"; In: "A Dissertation Presented to The Academic Faculty of the Georgia Institute of Technology"; Dec. 1, 2009; XP055173865; 239 Pages.

International Preliminary Report on Patentability; Application No. PCT/EP2019/071648; dated Nov. 3, 2020; 7 Pages.

Chinese Office Action and Search Report; Application No. 2019800525068; Completed: Feb. 11, 2023; 14 Pages.

European Office Action; Application No. 19 752 189.1; Completed Apr. 14, 2023; dated Apr. 17, 2023; 8 Pages.

* cited by examiner

METHOD OF CONTROLLING COOLING IN A DATA CENTRE

TECHNICAL FIELD

The present disclosure generally relates to cooling control in data centers.

BACKGROUND

A data center is a facility used to house servers. A data center has a plurality of rows of racks, where each rack includes many servers. The servers produce large amounts of energy causing heating of the room housing the servers. Since the electronics of the servers are sensitive to high temperatures, the data center is provided with a cooling system for cooling down the servers. The cooling system includes cooling units producing cold air or liquid and a distribution network for distributing the cold air/liquid to the racks including the servers. Cold air is typically supplied via openings in the floor in an aisle containing a row of server racks. This aisle is referred to as a cold aisle. The cold air flows from the cold aisle via the server racks to a next aisle on the other side of the server racks of the cold aisle. This next aisle is referred to as a hot aisle.

Cooling of a large data center requires much power. A large data center in an industrial-scale operation can use as much electricity as a small town. Almost half of the total electrical power is consumed by the cooling system, which is indispensable for safe operation of the servers.

Temperature in the cold aisle in a typical data center should remain within a given range defined by a contract of the operator of the data center. During operation, the desired temperature in the cold aisle is normally set by the operator manually after observing the temperatures measured in the cold aisle by a network of sensors. Thus the operator aims to avoid hot spots and overcooling in the data center by manually changing the cooling power supplied by cooling equipment to the data center room according to the dynamic changes of the IT load.

The power consumption in a data center depends on several types of cooling equipment and on the power consumption of the servers due to IT load. For example, aisle cooling units such as Computer Room Air Handlers (CRAH) consume more power when they must produce more cooling power. This means cooling units operating with low temperature settings and high airflow settings will have higher power consumption. Additionally, servers typically have small server fans for cooling the internal heat sources of the servers, like the central processing unit (CPU) or the memories. The server fans are usually very inefficient. Typically the efficiency is around 25%. A medium-sized data center has hundreds of server racks, with each server rack having tens of servers, and each server has a plurality of server fans. The power losses in the server fans hence form a considerable part of the power consumption of a data center.

The US patent application US 2017/187592 A1 discloses a system for determining cooling set-points in sync with dynamic demand. In order to reduce the overall cooling cost, this document states that it is important to ensure coordinated optimization across various cooling hardware. The approach of minimizing energy usage for single cooling equipment may cause overall rise in the energy expenditure.

SUMMARY

The approach disclosed in US 2017/187592 A1 does however not provide optimal solutions for the trade-off between performing sufficient cooling and minimizing power consumption. In particular, according to US 2017/187592 A1 the "optimization" is performed by first determining cooling set points, predicting CPU temperatures using the cooling set points and comparing the predicted CPU temperatures to a critical threshold. If the predicted temperature is above a critical temperature, the cooling set points are adjusted and the process is reiterated until the predicted CPU temperature is below the critical threshold. In this case, the accuracy of the predicted CPU temperatures is determined, and finally the "optimal" set points are applied to the cooling hardware.

In view of the above, an object of the present disclosure is to provide a method of controlling cooling in a data center which solves, or at least mitigates, the problems of the prior art.

There is hence according to a first aspect of the present disclosure provided a method of controlling the cooling of servers in a data center comprising a plurality of server racks each comprising a plurality of servers, the cooling being provided by aisle cooling units via a cold isle and by server fans, wherein the method comprises: obtaining temperature measurements from temperature sensors in the data center, performing an optimization of the total power consumption of the aisle cooling units and the servers based on the temperature measurements, with constraints on a cold aisle temperature and on an air flow level of the aisle cooling units, and controlling the aisle cooling units based on the optimization.

The total power consumption of a data center may hence be reduced while sufficient cooling of the servers may be maintained. A reduction of the total power consumption is good from a sustainability standpoint. It furthermore reduces the cost of cooling. Additionally, by preventing the servers from overheating, the lifetime of the data center equipment may be prolonged and could potentially increase the maintenance intervals.

The constraint on the air flow level of the aisle cooling units is an interval of air flow in which the aisle cooling units are designed to operate.

According to one embodiment the optimization is a multi-objective optimization comprising only two objectives of which a first objective is the power consumption of the aisle cooling units and a second objective is the power consumption of the servers.

A balance may hence be achieved between two conflicting features, namely optimal power consumption of the aisle cooling units and optimal power consumption of the servers in order to minimize the total cooling power consumption.

One embodiment comprises prior to the step of optimization, performing an initial single objective optimization of each of the first objective and of the second objective separately to obtain a minimum for each of the first objective and the second objective.

According to one embodiment the optimization results in a set of Pareto optimal solutions, wherein the controlling is based on one of the Pareto optimal solutions.

One embodiment comprises selecting a Pareto optimal solution from the set of Pareto optimal solutions based on a predetermined selection rule.

According to one embodiment the selection rule is to use that Pareto optimal solution which provides the minimum power consumption of the aisle cooling units.

According to one embodiment the selection rule is to use that Pareto optimal solution which provides the minimum power consumption of the servers.

According to one embodiment the constraint on the cold aisle temperature is a range of cold aisle temperatures between a minimum allowed contractual temperature and a maximum allowed contractual temperature.

According to one embodiment the constraint on the air flow level is a range of fan speeds of aisle cooling unit fans in which the aisle cooling units are designed to operate.

According to one embodiment the total power consumption of the servers is a sum of the power consumption of the server fans and of power consumption due to IT load. Power consumption due to IT load is the power consumed by the servers in operation.

The power consumption due to IT load is preferably merely used as a disturbance input parameter in the optimization and is not a control variable.

According to one embodiment the aisle cooling units are Computer Room Air Handler, CRAH, units.

There is according to a second aspect of the present disclosure provided a computer program comprising computer code which when executed by processing circuitry of a data center control system causes the data center control system to perform the steps of the method according to the first aspect.

There is according to a third aspect of the present disclosure provided a computer program product comprising a storage medium including the computer program of the second aspect.

There is according to a fourth aspect of the present disclosure provided a data center control system for controlling the cooling of servers in a data center comprising a plurality of server racks each comprising a plurality of servers, the cooling being provided by aisle cooling units via a cold isle and by server fans, wherein the data center control system comprises: a storage medium comprising computer code, and processing circuitry which when executing the computer code causes the data center control system to perform the steps of the method of the first aspect.

Generally, all terms used in the claims are to be interpreted according to their ordinary meaning in the technical field, unless explicitly defined otherwise herein. All references to "a/an/the element, apparatus, component, means, etc. are to be interpreted openly as referring to at least one instance of the element, apparatus, component, means, etc.", unless explicitly stated otherwise.

BRIEF DESCRIPTION OF THE DRAWINGS

The specific embodiments of the inventive concept will now be described, by way of example, with reference to the accompanying drawings, in which.

DETAILED DESCRIPTION

Figures 1, 2:
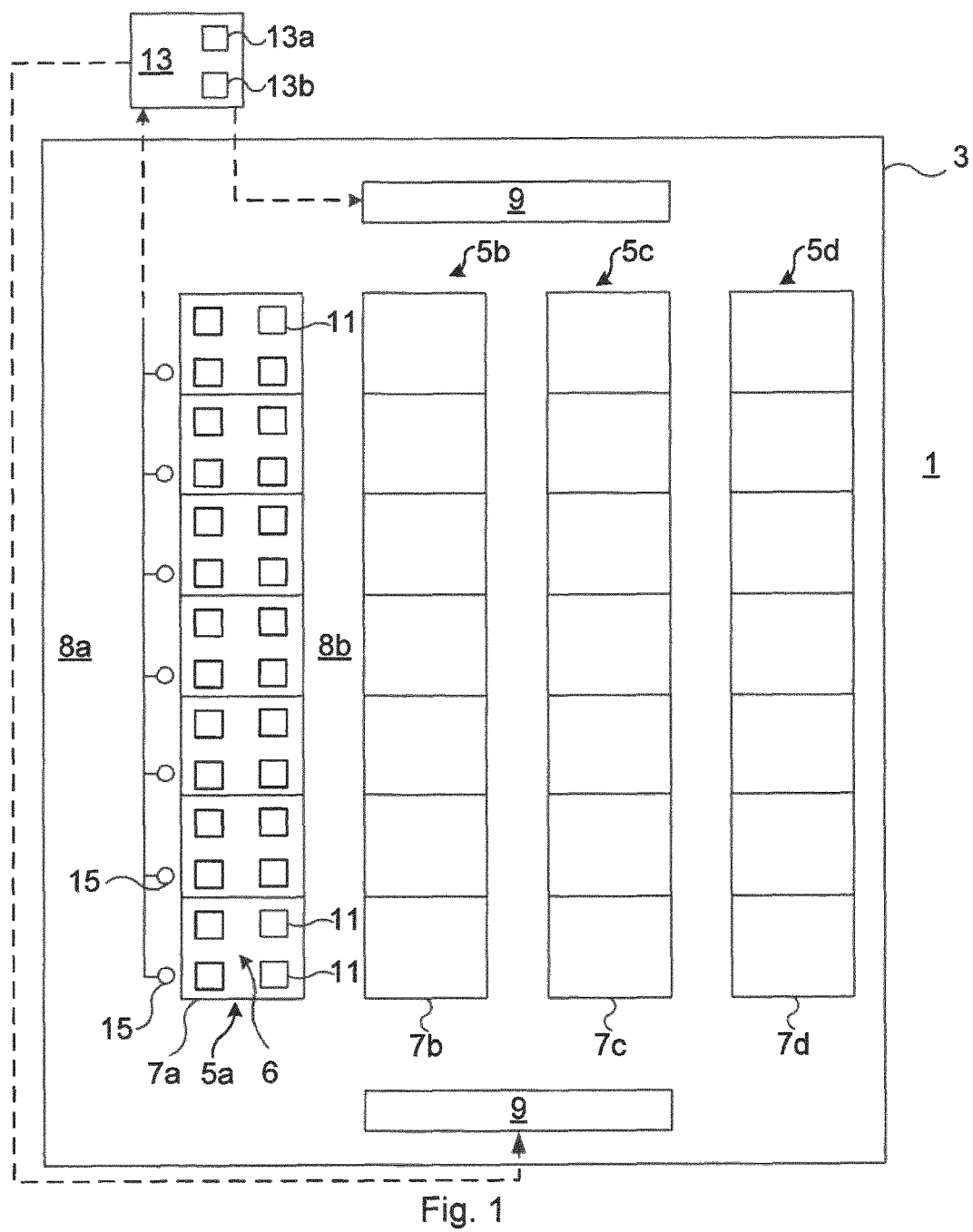
FIG. 1 schematically shows a top view of an example of a data center including a plurality of rows of server racks and cooling equipment.
FIG. 2 is a flowchart of a method of controlling the cooling of servers in the data center.

The inventive concept will now be described more fully hereinafter with reference to the accompanying drawings, in which exemplifying embodiments are shown. The inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art.

Like numbers refer to like elements throughout the description.

FIG. 1 shows an example of a data center 1. The data center 1 has a data center room 3. The data center room 3 may comprise a raised floor provided with perforations. The data center room 3 comprises a plurality of rows 5a-5d of server racks 7a-7d. Each server rack 7a-7d comprises a plurality of servers 6. The server racks 7a-7d are arranged on the raised floor.

The data center 1 furthermore comprises cooling equipment configured to cool the servers 6. In the present example, the cooling equipment includes aisle cooling units 9 and server fans 11. The aisle cooling units 9 may for example be CRAHs. CRAHs have two controllable parameters, namely the temperature of a cooling coil, and the speed of the CRAH fans, or aisle cooling unit fans, which blow air over the cooling coil. Each server fan 11 is arranged to cool a specific server 6. In particular, the server fans 11 may be configured to cool one or more heat-emitting electronic component such as a CPU, one or more memories or a power supply, of a server. A plurality of server fans 11 may be provided to cool each server 6.

The aisle cooling units 9 have cooling outlets arranged to provide cold air below the raised floor by means of aisle cooling unit fans. There may be an airflow distribution system below the raised floor, configured to distribute 3o the cold air stream from the aisle cooling unit fans to the cold aisles where the cold air flows through the perforated raised floor into a cold aisle of the data center room 3 to cool the server racks 5a-5d. Every other aisle in which a row of server racks 7a-7d stand is generally a cold aisle, such that the cold aisles and hot aisles are arranged alternatingly. In the example in FIG. 1, the aisle 8a left of row 5a is a cold aisle and the aisle 8b right of row 5a is a hot aisle.

A data center control system 13 is configured to control the aisle cooling units 9. The data center control system 13 comprises a storage medium 13a comprising computer code, and processing circuitry 13b. The data center control system 13 may furthermore comprise a plurality of controllers. The processing circuitry 13b may be configured to provide set point values to the controllers which control the aisle cooling units 9 to thereby control the cooling of the servers in the server racks 7a-7d. The data center control system 13 may in particular be configured to provide set points for controlling the temperature of the aisle cooling units 9 and for controlling the air flow level of the aisle cooling unit fans.

The storage medium 13a may for example be embodied as a memory, such as a random-access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory.

The processing circuitry 13b may use any combination of one or more of a suitable central processing unit (CPU), a graphics processing unit (GPU), multiprocessor, microcontroller, digital signal processor (DSP), application specific integrated circuit (ASIC), field programmable gate arrays (FPGA) etc., capable of executing any herein disclosed operations concerning optimization and cooling control.

The data center room 3 may comprise a plurality of temperature sensors 15. The temperature sensors 15 may be configured to measure the temperature in several different points of the room. According to some example embodiments the temperature sensors could be configured to measure the temperature in the cold aisle, i.e. the cold aisle temperature. The temperature measurements of the cold aisle temperature from all of the sensors 15 in an aisle may form a temperature measurement vector. The temperature sensors 15 may be configured to communicate with the data center control system 13. In particular, the sensors 15 may be configured to send the temperature measurements to the data center control system 13.

The temperature measurements may be used for controlling the cooling equipment as will be described in more detail in what follows.

The data center control system 13 may furthermore be configured to obtain the IT load for each server 6.

An example of a method for controlling the cooling of the cooling equipment by means of the data center control system 13 will now be described with reference to FIG. 2.

In a step S1 temperature measurements are obtained by the data center control system 13 from the temperature sensors 15.

In a step S2 an optimization of the total power consumption of the aisle cooling units 9 and of the servers 6 is performed.

According to one example of the optimization, there may be a constraint on the cold aisle temperature. This constraint may concern a range of allowable cold aisle temperatures according to the contract with the data center operator, i.e. minimum and maximum allowed contractual temperatures.

There may also be a constraint on the air flow level provided by the aisle cooling units 9. The constraint on the air flow level may for example be based on the physical restrictions on the aisle cooling units 9, i.e. the minimum and the maximum air flow that can be delivered by the aisle cooling units 9, in particular by the aisle cooling unit fans.

The optimization in step S2 may be a multi-objective optimization, preferably a bi-objective optimization. In particular, only two objectives are optimized. A first of the two objectives is the power consumption of the aisle cooling units 9 and a second of the two objectives is the power consumption of the servers 6. An example of a bi-objective optimization formulation is shown below.

$$\min\{F1(T,A), F2(T, IT\text{load})\} \quad (1)$$

$$\text{such that } T_{min} \leq T \leq T_{max} \quad (2)$$

$$A_{lower} \leq A \leq A_{upper} \quad (3)$$

where F1 is the total power consumption of all aisle cooling units 9, and $F1=\Sigma F1i$ where $i=1, \ldots, n$ and n is the number of aisle cooling units 9 and F1i is the power consumption of the i:th aisle cooling unit 9. F2 is the total power consumption of all the servers 6, and $F2=\Sigma F2j$ where $j=1, \ldots, m$, and m is the number of server fans 11. T is a cold aisle temperature vector which in this example has length n, and $T_{min}$ and $T_{max}$ are the limits on the cold aisle temperature according to the contract. A is the air flow level vector of the air flow level of the aisle cooling units 9, with n elements. IT load is a fixed vector of IT loads for each server. This vector is of length k with $k \leq m$ equal to the number of servers. It is an input parameter in optimization (1)-(3), describing the current IT load distribution between the servers. There may according to some variations of the optimization be additional constraints.

In one example, the objective may be to minimize the total power consumption of the aisle cooling units 9 and of the servers 6 in a manner which provides a single solution. This may in one example be a special case of multi-objective optimization, where the sum of the two objective functions F1 and F2 is optimized.

The power consumption of the aisle cooling units 9 may for example be a numerical model based on first principles or a computational fluid dynamics (CFD) model. Alternatively, the model may be based on real operational data. Optimization variables, or decision variables, are the cold aisle temperatures T and A, the air flow level of the aisle cooling units 9. An extra input parameter is the vector of IT loads for each server.

The power consumption of the servers 6 is related to the speed, i.e. the angular speed, of the server fans 11 and the IT load. A numerical model could for example be used to obtain the power consumption of the servers 6. Alternatively, real measurements from historical records may be used based on the measured IT loads to determine the power consumption. Historical records may for example be contained in a look-up table where the power consumption of each server 6 is available based on a given cold aisle temperature. The IT loads are the fixed input parameter and the sum of the power consumed by each server at the particular IT load is the output. It may be noted that the function F2 implicitly depends on the server fan speeds, since it depends on the cold aisle temperature which in part depends on the operation of the server fans 11.

The bi-objective optimization problem may be solved numerically for example by means of the epsilon-constraint method, the method of weighted sums, or the lexicographical method.

In a step S3 the aisle cooling units 9 are controlled by the data center control system 13 based on the result of the optimization in step S2.

Step S3 may involve providing set points to the controllers which control the aisle cooling units 9. The set points are for setting the temperature in the aisle cooling units 9 and/or the speed of aisle cooling unit fans, i.e. to set the air flow levels.

According to one example, prior to step S1 the set up for the optimization may be defined. For example, whether single and/or bi-optimization is to be performed may be set. In the event of bi-objective optimization, the number of Pareto optimal solutions that are to be calculated may be determined, the method of multi-objective optimization may be selected, and depending on the method the corresponding parameters may be selected. Furthermore, constraints for the optimization may be defined.

Furthermore, according to one example prior to step S2 two initial single-objective optimizations may be performed, one for each of the first objective in and the second objective to obtain a minimum for each of the first objective and the second objective.

In case step S2 is a bi-objective optimization the optimization results in a set of Pareto optimal solutions. In case the two initial single-objective optimizations have been performed, the two solutions thus obtained, form Pareto optimal points on the Pareto frontier. They may hence be contained in the set of Pareto optimal solutions.

If during the set up it has been defined that several Pareto optimal solutions can be permitted, one of the Pareto optimal solutions will be selected for controlling the aisle cooling units 9.

The Pareto optimal solution may for example be selected by means of a predetermined selection rule. The selection rule may for example be to use that Pareto optimal solution which provides the minimum power consumption of the aisle cooling units or of the servers, i.e. one of the two solutions obtained in the two initial single-objective optimizations. Often, the selected Pareto optimal solution may be the one which provides the minimum power consumption for the aisle cooling units 9, or close to the minimum power consumption of the aisle cooling units 9, of a single objective optimization with the objective to minimize the power consumption of the aisle cooling units 9. Thus, preferably, a Pareto optimal solution is selected where the first objective i.e. the power consumption of the aisle cooling units 9, is in some sense prioritized for example by means of weights.

According to one variation, an operator or user may manually select the preferred Pareto optimal solution to be used in step S3. The Pareto optimal solutions may for example be visualized as a Pareto frontier and the user may then easily compare different alternative Pareto optimal solutions and chose the most appropriate one based on e.g. experience.

The inventive concept has mainly been described above with reference to a few examples. However, as is readily appreciated by a person skilled in the art, other embodiments than the ones disclosed above are equally possible within the scope of the inventive concept, as defined by the appended claims.

The invention claimed is:

1. A method of controlling the cooling of servers in a data center comprising a plurality of server racks each including a plurality of servers, the cooling being provided by aisle cooling units via a cold aisle and by server fans, wherein the method comprises:
    obtaining temperature measurements from temperature sensors in the data center,
    performing an optimization of the total power consumption of the aisle cooling units and of the servers based on the temperature measurements, with constraints on a cold aisle temperature and on an air flow level of the aisle cooling units, the optimization being a multi-objective including only two objectives of which is a first objective is a power consumption of the aisle cooling units and a second objective is a power consumption of the servers, and
    controlling the aisle cooling units by providing set points based on the optimization to one or more controllers, the set points being configured to adjust the cooling provided by the aisle cooling units;
    wherein the method further includes prior to the step of optimization, performing an initial single objective optimization of each of the first objective and the second objective separately to obtain a minimum for each of the first objective and the second objective.

2. The method as claimed in claim 1, wherein the optimization results in a set of Pareto optimal solutions, wherein the controlling is based on one of the Pareto optimal solutions.

3. The method as claimed in claim 2, comprising selecting a Pareto optimal solution from the set of Pareto optimal solutions based on a predetermined selection rule.

4. The method as claimed in claim 3, wherein the selection rule is to use that Pareto optimal solution which provides the minimum power consumption of the aisle cooling units.

5. The method as claimed in claim 3, wherein the selection rule is to use that Pareto optimal solution which provides the minimum power consumption of the servers.

6. The method as claimed in claim 1, wherein the constraint on the cold aisle temperature is a range of cold aisle temperatures between a minimum allowed contractual temperature and a maximum allowed contractual temperature.

7. The method as claimed in claim 1, wherein the constraint on the air flow level is a range of fan speeds of aisle cooling unit fans in which the aisle cooling units are designed to operate.

8. The method as claimed in claim 1, wherein the total power consumption of the servers is a sum of the power consumption of the server fans and of power consumption due to IT load.

9. The method as claimed in claim 1, wherein the aisle cooling units are Computer Room Air Handler, CRAH, units.

10. The method as claimed in claim 1, wherein the optimization results in a set of Pareto optimal solutions, wherein the controlling is based on one of the Pareto optimal solutions.

11. The method as claimed in claim 10, comprising selecting a Pareto optimal solution from the set of Pareto optimal solutions based on a predetermined selection rule.

12. The method as claimed in claim 1, wherein the constraint on the cold aisle temperature is a range of cold aisle temperatures between a minimum allowed contractual temperature and a maximum allowed contractual temperature.

13. The method as claimed in claim 1, wherein the constraint on the air flow level is a range of fan speeds of aisle cooling unit fans in which the aisle cooling units are designed to operate.

14. The method as claimed in claim 1, wherein the set points are configured to set a temperature in the aisle cooling units and/or a speed of aisle cooling unit fans of the aisle cooling units.

15. A computer program product comprising a non-transitory storage medium and a computer program stored in the storage medium, the computer program including a computer code which is configured to control the cooling of servers in a data center having a plurality of server racks each including a plurality of servers, the cooling being provided by aisle cooling units via cold aisle and by server fans, the computer code when executed by processing circuitry of a data center control system causes the data center control system to perform a method including the steps of:
    obtaining temperature measurements from temperature sensors in the data center,
    performing an optimization of the total power consumption of the aisle cooling units and of the servers based on the temperature measurements, with constraints on a cold aisle temperature and on an air flow level of the aisle cooling units, the optimization being a multi-objective optimization including only two objectives of which a first objective is a power consumption of the aisle cooling units and a second objective is a power consumption of the servers, and
    controlling the aisle cooling units by providing set points based on the optimization to one or more controllers, the set points being configured to adjust the cooling provided by the aisle cooling units;
    wherein the method further includes prior to the step of optimization, performing an initial single objective optimization of each of the first objective and of the second objective separately to obtain a minimum for each of the first objective and the second objective.

16. A data center control system for controlling the cooling of servers in a data center comprising a plurality of server racks each including a plurality of servers, the cooling being provided by aisle cooling units via a cold isle and by server fans, wherein the data center control system comprises:

a storage medium including a computer code, and
processing circuitry which when executing the computer code causes the data center control system to perform a method including the steps of:
obtaining temperature measurements from temperature sensors in the data center,
performing an optimization of the total power consumption of the aisle cooling units and of the servers based on the temperature measurements, with constraints on a cold aisle temperature and on an air flow level of the aisle cooling units, the optimization being a multi-objective optimization including only two objectives of which a first objective is a power consumption of the aisle cooling units and a second objective is a power consumption of the servers, and
controlling the aisle cooling units by providing set points based on the optimization to one or more controllers, the set points being configured to adjust the cooling provided by the aisle cooling units;
wherein the method further includes prior to the step of optimization, performing an initial single objective optimization of each of the first objective and of the second objective separately to obtain a minimum for each of the first objective and the second objective.

* * * * *